(12) United States Patent
Nagano et al.

(10) Patent No.: US 6,271,723 B1
(45) Date of Patent: Aug. 7, 2001

(54) DISTORTION COMPENSATING DEVICE

(75) Inventors: Terufumi Nagano; Yoichi Okubo; Yasuo Sera; Masaki Suto; Hidefumi Ito, all of Sendai (JP)

(73) Assignee: Kokusai Electric Co., Ltd., Tokyo (JP)

( * ) Notice: Subject to any disclaimer, the term of this patent is extended or adjusted under 35 U.S.C. 154(b) by 0 days.

(21) Appl. No.: 09/512,331

(22) Filed: Feb. 24, 2000

(30) Foreign Application Priority Data

Feb. 24, 1999 (JP) ................................................. 11-046059

(51) Int. Cl.[7] .......................................................... H03F 1/26
(52) U.S. Cl. .............................. 330/149; 330/151; 455/63; 375/296
(58) Field of Search ................................... 330/149, 151; 455/63; 375/296, 297

(56) References Cited

U.S. PATENT DOCUMENTS

| | | | | |
|---|---|---|---|---|
| 4,157,508 | * | 6/1979 | Hecken | 328/142 |
| 5,304,944 | * | 4/1994 | Copeland et al. | 330/149 |
| 5,850,305 | * | 12/1998 | Pidgeon | 359/187 |
| 6,081,159 | * | 6/2000 | Kim et al. | 330/149 |
| 6,122,085 | * | 6/2000 | Bitler | 359/180 |

* cited by examiner

Primary Examiner—Robert Pascal
Assistant Examiner—Henry Choe
(74) Attorney, Agent, or Firm—Wenderoth, Lind & Ponack, L.L.P.

(57) ABSTRACT

A distortion compensating device comprises a 3 dB coupler having four terminals. The first terminal supplies an input signal to be inputted to an amplifier or is supplied with an input signal from an amplifier. The second terminal is associated with a third-order distortion generator for generating a third-order distortion having an amplitude for canceling out a third-order distortion generated by the amplifier depending on the supplied input signal. The third terminal is associated with a phase adjuster for adjusting the phase of the input signal to set the phase difference between the input signal and the third-order distortion generated by the third-order distortion generator to a phase difference for canceling out the third-order distortion generated by the amplifier. The fourth terminal combines and outputs the third-order distortion generated by the third-order distortion generator and the input signal whose phase is adjusted by the phase adjuster for compensating for the third-order distortion generated by the amplifier.

31 Claims, 8 Drawing Sheets

DISTORTION COMPENSATING DEVICE

BACKGROUND OF THE INVENTION

1. Field of the Invention

The present invention relates to a distortion compensating device for compensating for a third-order distortion produced by an amplifier, and more particularly to a distortion compensating device which comprises a four-terminal power distributor connected to a third-order distortion generator and a phase adjuster for a size reduction.

2. Description of the Related Art

It has been known in the art that an amplifier generates high-order distortions when the amplifier amplifies a signal. Particularly, it is known that a third-order distortion generated by the amplifier adversely affects the signal processing performed by the amplifier. If a signal having a certain frequency which is inputted to the amplifier is referred to as a fundamental signal, then the amplifier generates a third-order distortion depending on the fundamental signal, the third-order distortion having a frequency different from the frequency of the fundamental signal.

One way of compensating a third-order distortion generated by an amplifier is to generate a distortion-compensating third-order distortion at a stage preceding the amplifier and cancel out the third-order distortion generated by the amplifier with the distortion-compensating third-order distortion. A distortion compensating device for generating such a distortion-compensating third-order distortion may combine a third-order distortion generated by a phase adjuster, for example, with a linear signal in an appropriate phase relationship and output the combined signal to a subsequent amplifier. Another distortion compensating device may comprise a third-order distortion generator and a wide-band phase unit.

However, the conventional distortion compensating devices are large in scale and cannot be reduced in size because they have two separate signal processing systems, e.g., a signal processing system for processing an inputted fundamental signal and a signal processing system for generating a third-order distortion, and a separate combiner for combining output signals from the two signal processing systems, i.e., a fundamental signal and a third-order distortion signal.

The conventional distortion compensating devices need a wide-band LNA (Low Noise Amplifier) for amplifying a third-order distortion because a large signal loss occurs when the third-order distortion is generated. The conventional distortion compensating devices also require a complex external control circuit and a memory circuit for storing control information because a highly accurate control process is necessary for generating a third-order distortion suitable for distortion compensation.

For the above reasons, there has been a demand for the development of a distortion compensating device that can be reduced in size and has a low power requirement.

SUMMARY OF THE INVENTION

It is therefore an object of the present invention to provide a distortion compensating device having a relatively small size, for compensating for a third-order distortion produced by an amplifier.

Another object of the present invention is to provide a distortion compensating device having a reduced power requirement.

To achieve the above objects, there is provided in accordance with the present invention a distortion compensating device for compensating for a third-order distortion generated by an amplifier, comprising a power distributor having a first terminal for supplying an input signal to be inputted to an amplifier or being supplied with an input signal from an amplifier, a second terminal, and a third terminal, a third-order distortion generator connected to the second terminal for generating a third-order distortion having an amplitude for canceling out a third-order distortion generated by the amplifier depending on the supplied input signal, and a phase adjuster connected to the third terminal for adjusting the phase of the input signal to set the phase difference between the input signal and the third-order distortion generated by the third-order distortion generator to a phase difference for canceling out the third-order distortion generated by the amplifier, the power distributor having a fourth terminal for combining and outputting the third-order distortion generated by the third-order distortion generator and the input signal whose phase is adjusted by the phase adjuster.

Since the distortion compensating device has four-terminal power distributor associated with the third-order distortion generator and the phase adjuster, the distortion compensating device may comprise a coupler unit having such a coupler, and can be reduced in size. Specific examples for setting up the amplitude of the third-order distortion generated by the third-order distortion generator and also setting up the phase difference to be adjusted by the phase adjuster will be described later on with reference to preferred embodiments of the present invention.

If the first terminal supplies the input signal to be inputted to the amplifier, then the distortion compensating device is positioned at a stage preceding the amplifier and supplies the input signal from the first terminal to the amplifier. If the first terminal is supplied with the input signal from the amplifier, then the distortion compensating device is positioned at a stage following the amplifier and is supplied with the input terminal outputted from the amplifier from the first terminal. At any rate, the distortion compensating device generates the third-order distortion for canceling the third-order distortion generated by the amplifier thereby to compensate for the third-order distortion generated by the amplifier.

The distortion compensating device may be used to compensate for third-order distortions generated by more than one amplifier. For example, the distortion compensating device may be arranged to compensate for third-order distortions generated by either a plurality of amplifiers preceding the distortion compensating device or a plurality of amplifiers following the distortion compensating device. Alternatively, the distortion compensating device may be arranged to compensate for a third-order distortion generated by at least one amplifier preceding the distortion compensating device and a third-order distortion generated by at least one amplifier following the distortion compensating device.

In order for the distortion compensating device to compensate for third-order distortions generated by a plurality of amplifiers, the distortion compensating device generates a third-order distortion capable of canceling the sum of the third-order distortions generated by the amplifiers. The principles of the present invention are therefore applicable to the compensation for a third-order distortion generated by a single amplifier or third-order distortions generated by plural amplifiers.

The principles of the present invention are applicable to various fields where the third-order distortion generated by an amplifier is to be compensated for. For example, the distortion compensating device according to the present invention may be incorporated in a communication unit of a portable telephone system for compensating for a third-order distortion generated by an amplifier in the communication unit, or a communication unit of a W-CDMA system for compensating for a third-order distortion generated by an amplifier in the communication unit. The communication unit may comprise a base station or a terminal.

The above and other objects, features, and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

Figure 1:
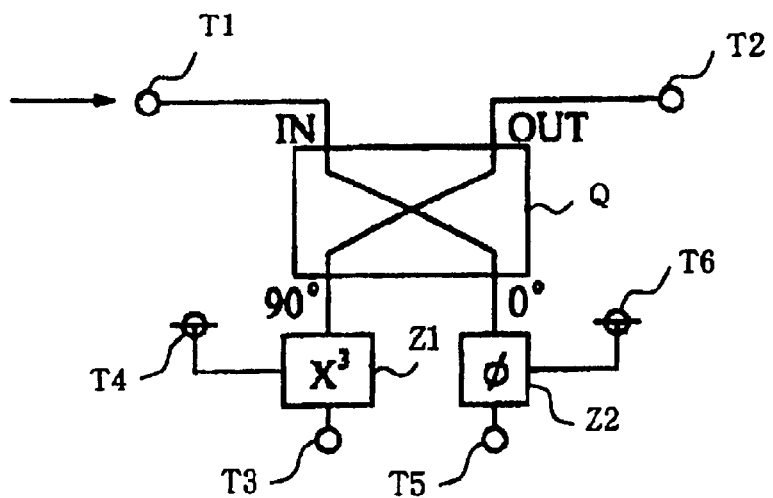
FIG. 1 is a block diagram of a distortion compensating device according to a first embodiment of the present invention.

FIG. 1 shows in block form a distortion compensating device according to a first embodiment of the present invention.

As shown in FIG. 1, the distortion compensating device according to the first embodiment of the present invention comprises a 3 dB coupler Q having four terminals including an input terminal T1, an output terminal T2, a 90. terminal, and a 0. terminal. The distortion compensating device also has a third-order distortion generator Z1 connected to the 90. terminal and comprising a semiconductor active element for generating a third-order distortion, and a phase adjuster Z2 connected to the 0. terminal for adjusting the phase of an input signal from the input terminal T1.

In the first embodiment, the distortion compensating device is used in each of portable telephone base stations and portable telephone terminals of a portable communication system. The distortion compensating device serves to compensate for a third-order distortion generated by an amplifier in each of the portable telephone base stations and the portable telephone terminals.

It is assumed that the distortion compensating device is disposed in a stage which precedes an amplifier that generates a third-order distortion to be compensated for, and a fundamental signal, i.e., a high-frequency signal transmitted from a portable telephone terminal or the like, applied to the amplifier is supplied from the input terminal T1. An example in which the distortion compensating device is disposed in a stage which follows an amplifier will be described later on with reference to FIG. 7.

When a fundamental signal is supplied from the input terminal T1, the third-order distortion generator Z1 generates a third-order distortion, and the phase adjuster Z2 adjusts the phase of the supplied fundamental signal. The 3 dB coupler Q combines a reflected wave of the third-order distortion generated by the third-order distortion generator Z1 and the phase-adjusted fundamental signal with each other, and outputs the combined signal from the output terminal T2.

When the 90. terminal and the 0. terminal of the 3 dB coupler Q are short-circuited or opened, the supplied signal wave is fully reflected. The 3 dB coupler Q can now output the fundamental signal supplied from the input terminal T1 from the output terminal T2 with an ideal efficiency. In order to reduce the attenuation of a signal passing through the 3 dB coupler Q based on the above property of the 3 dB coupler Q, a terminal T3 of the third-order distortion generator Z1 and a terminal T5 of the phase adjuster Z2 are short-circuited or opened.

The 3 dB coupler Q is capable of removing an even-numbered-order distortion when such an even-numbered-order distortion is parasitically generated together with the third-order distortion by the third-order distortion generator Z1, and is also capable of removing an unwanted signal component such as a leakage wave from another system (e.g., a communication system) or a local signal.

The distortion compensating device has a control voltage terminal T4 for controlling the amplitude of a third-order distortion generated by the third-order distortion generator Z1 and a control voltage terminal T6 for controlling the phase difference between the fundamental signal and the third-order distortion. The amplitude ratio and phase difference between the third-order distortion and the fundamental signal can be controlled depending on the magnitudes of DC voltages applied to the control voltage terminals T4, T6. Any variation in a signal loss as it passes through the distortion compensating device is small and stable even when the DC voltages applied to the control voltage terminals T4, T6 change.

Specific structural details of the distortion compensating device will be described below.

Figure 2:
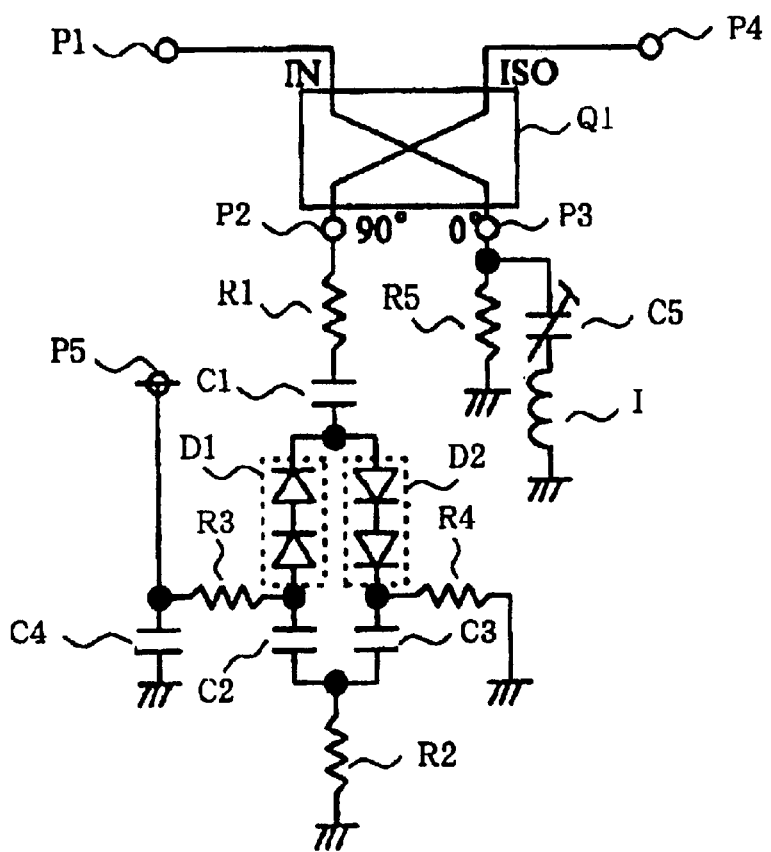
FIG. 2 is a circuit diagram of the distortion compensating device according to the first embodiment of the present invention.

FIG. 2 shows a circuit arrangement of the distortion compensating device according to the first embodiment. In FIG. 2, a 3 dB coupler Q1, an input terminal (IN) P1, a 90. terminal P2, a 0. terminal P3, an output terminal (ISO) P4, and a control voltage terminal P5 of the third-order distortion generator are identical to the 3 dB coupler Q, the input terminal T1, the 90. terminal, the 0. terminal, the output terminal T2, and the control voltage terminal T4, respectively, shown in FIG. 1. In FIG. 2, a control voltage terminal of the phase adjuster is omitted from illustration.

The 3 dB coupler Q1 serves as a power distributor having four terminals. Specifically, the input terminal P1 serves as a first terminal for supplying a signal to an amplifier or being supplied with a signal from an amplifier. The 90. terminal P2 serves as a second terminal associated with the third-order distortion generator for generating a third-order distortion depending on an input signal. The 0. terminal P3 serves as a third terminal associated with the phase adjuster for adjusting the phase of the input terminal. The 0. terminal P3 serves as a third terminal associated with the phase adjuster for adjusting the phase of an input signal. The output terminal P4 serves as a fourth terminal for combining a third-order distortion generated by the third-order distortion generator and an input signal whose phase has been adjusted by the phase ajuster, and outputting the combined signal.

The third-order distortion generator connected to the 90. terminal P2 will be described below.

The third-order distortion generator comprises a fixed resistor R1 connected to the 90. terminal P2, a capacitor C1 connected in series with the fixed resistor R1, two diode assemblies D1, D2 connected to the capacitor C1 parallel to each other in opposite directions, two capacitors C2, C3 connected in series with the diode assemblies D1, D2, respectively, a fixed resistor R2 connecting the capacitors C2, C3 to ground, a fixed resistor R3 connected between the diode assembly Dd1 and the capacitor C2, a capacitor C4 connecting the fixed resistor R3 to ground, and a fixed resistor R4 connecting the junction between the diode assembly D2 and the capacitor C3 to ground. The control voltage terminal P5 is connected to the diode assembly D1 through the fixed resistor R3.

The fixed resistor R1 serves as a first fixed resistor, the capacitor C1 as a first capacitor, the two diode assemblies D1, D2 as two diode assemblies, the capacitor C2 as a second capacitor, the capacitor C3 as a third capacitor, the fixed resistor R2 as a second fixed resistor, the fixed resistor R3 as a third fixed resistor, the capacitor C4 as a fourth capacitor, and the fixed resistor R4 as a fourth fixed resistor.

The fixed resistor RI is a matching resistor for matching the impedances of the 90. terminal P2 and the third-order distortion generator. The three capacitors C1–C3 are DC voltage blocking capacitors for blocking DC voltages and for being short-circuited at high frequencies. The fixed resistor R2 comprises a resistor which is terminated or opened at high frequencies. Each of the diode assemblies D1, D2 comprises a pair of series-connected Schottky barrier diodes or the like that act as distortion generating elements. When a high-frequency signal is supplied to the diode assemblies D1, D2, the Schottky barrier diodes or the like generate a third-order distortion. The two resistors R3, R4 which are open at high frequencies and the capacitor C4 which blocks high frequencies jointly make up a bias circuit for the diode assemblies D1, D2. The bias circuit is open at high frequencies or blocks high frequencies.

Instead of the diode assemblies D1, D2 connected parallel to each other in opposite directions, only a single diode assembly may be connected to the capacitor C1. However, the diode assemblies D1, D2 connected parallel to each other in opposite directions are preferable because they can reduce characteristic variations due to temperature changes. The number of diodes of each of the diode assemblies D1, D2 is not limited to any number, but may be determined based on the electric power applied thereto, the amplitude ratio between a required output wave and a third-order distortion, etc.

If the diode assemblies D1, D2 are terminated at high frequencies by the fixed resistor R2, then a reflected wave can be produced at the junction between the capacitor C1 and the diode assemblies D1, D2. On the other hand, if the diode assemblies D1, D2 are opened at high frequencies by the fixed resistor R2, then a reflected wave can be produced at the junction between the diode assemblies D1, D2 and the fixed resistor R2. It is possible to select one of these two configurations which is more preferable in view of the amplifier whose third-order distortion is to be compensated for.

When a fundamental signal is supplied from the input terminal P1 to the 90. terminal P2, the diode assemblies D1, D2 generate a third-order distortion depending on the supplied fundamental signal. A reflected wave containing the generated third-order distortion is outputted to the output terminal P4. The amplitude of only the generated third-order distortion can variably be controlled by controlling a DC voltage supplied from the control voltage terminal P5.

The third-order distortion generated by the third-order distortion generator has an amplitude set to a level for canceling out the third-order distortion generated by the amplifier which is to be compensated for. Theoretically, the amplitude ratio between the fundamental signal inputted to the distortion compensating device and the third-order distortion generated by the distortion compensating device is set to the same value as the amplitude ratio between the fundamental signal inputted to the amplifier whose third-order distortion is to be compensated for and the third-order distortion generated by the amplifier, for thereby meeting the amplitude requirements for canceling out the third-order distortion generated by the amplifier. In an actual distortion compensating device, the amplitude of the third-order distortion generated by the third-order distortion generator may be set to an arbitrary level depending on the required accuracy of distortion compensation.

The phase adjuster connected to the 0. terminal P3 will be described below.

The phase adjuster comprises a fixed resistor R5 and a variable capacitor C5 which are connected parallel to each other and to the 0. terminal P3, and an inductor I connected in series to the variable capacitor C5. Ends of the fixed resistor R5 and the variable capacitor C5 remote from the 0. terminal P3 are grounded. The fixed resistor R5 comprises a resistor having a resistance of 100 k., for example, which is open at high frequencies. The parallel-connected circuit of the fixed resistor R5 and the variable capacitor C5 is open at a wide range of frequencies. The variable capacitor C5 comprises a variable-capacitance diode, for example, and may be in the form of a trimmer capacitor, for example.

The phase adjuster is capable of adjusting the phase of only a fundamental signal due to resonance depending on the combined reactance of the variable capacitor C5 and the inductor I which are connected in series with each other. Specifically, when a fundamental signal is supplied from the input terminal P1 to the 0. terminal P3, the phase adjuster adjusts the phase of only the fundamental signal to adjust the phase difference between the fundamental signal and the third-order distortion generated by the third-order distortion generator. The phase adjuster can output a reflected wave of the phase-adjusted fundamental signal to the output terminal P4. The phase adjuster can also variably control the phase difference between the fundamental signal and the third-order distortion by controlling the capacitance of the variable capacitor C5 with the DC voltage applied from the control voltage terminal (not shown).

The phase difference adjusted by the phase difference is set to a value for canceling out the third-order distortion generated by the amplifier which is to be compensated for. Theoretically, the phase difference between the fundamental signal and the third-order distortion, which is outputted from the distortion compensating device, is selected to be 180. out of phase with the phase difference between the fundamental signal inputted to the amplifier whose third-order distortion is to be compensated for and the third-order distortion generated by the amplifier, for thereby meeting the phase difference requirements for canceling out the third-order distortion generated by the amplifier.

Specifically, if the phase difference of the third-order distortion with the fundamental signal in the amplifier is α, then the phase difference of the third-order distortion with the fundamental signal in the distortion compensating device may be set to (α+180.). In an actual distortion compensating device, the phase difference adjusted by the phase adjuster may be set to an arbitrary level depending on the required accuracy of distortion compensation.

By thus meeting the requirements for the amplitude of the third-order distortion generated by the third-order distortion generator and the requirements for the phase difference adjusted by the phase adjuster, the distortion compensating device is able to generate a third-order distortion for canceling out the third-order distortion generated by the amplifier.

The amplitudes and phases of a fundamental signal and a third-order distortion at the terminals P1–P4 in a distortion compensating process carried out by the distortion compensating device are shown in FIGS. 3 through 6. In FIGS. 3 through 6, the fundamental signal and the third-order distortion are represented by vectors in a complex plane, and the lengths of the vectors indicate amplitudes and the angles of the vectors indicate phases.

Figure 3:
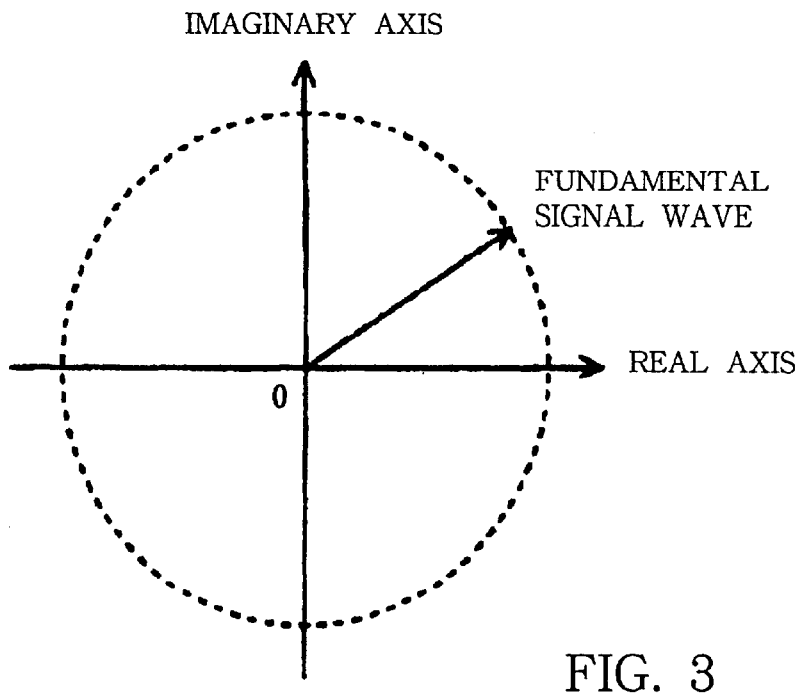
FIG. 3 is a diagram showing the amplitude and phase of a fundamental signal at an input terminal.

FIG. 3 shows, by way of example, a fundamental signal applied to the input terminal P1 of the 3 dB coupler Q1. In the examples shown in FIGS. 4 through 6, the fundamental signal shown in FIG. 3 is applied to the input terminal P1.

Figure 4:
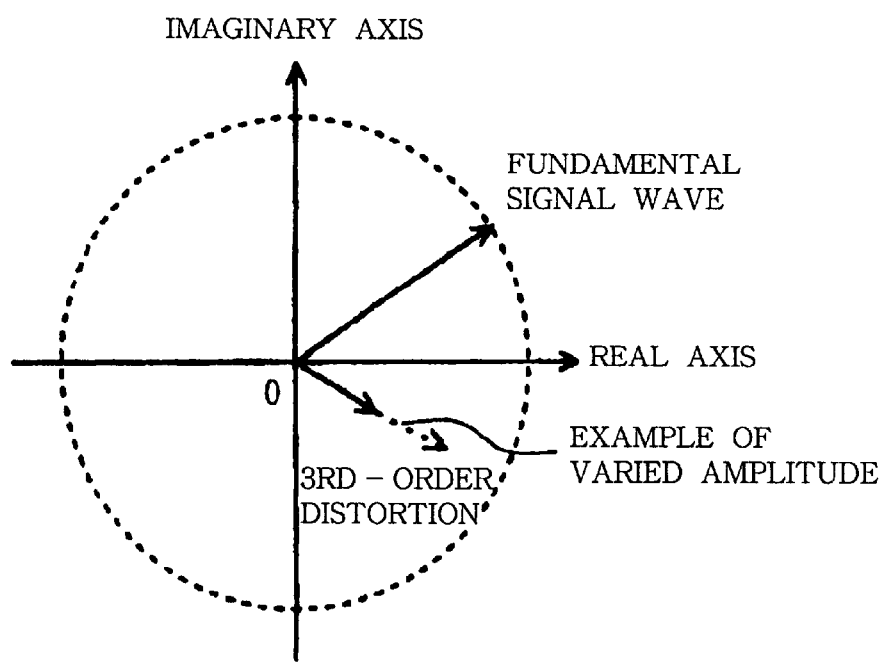
FIG. 4 is a diagram showing the amplitude and phase of a fundamental signal and a third-order distortion at a 90. terminal.

FIG. 4 shows, by way of example, a reflected wave of a third-order distortion at the 90. terminal P2 of the 3 dB coupler Q1 and the fundamental signal. In the example shown in FIG. 4, the amplitude of the third-order distortion can variably be controlled.

Figure 5:
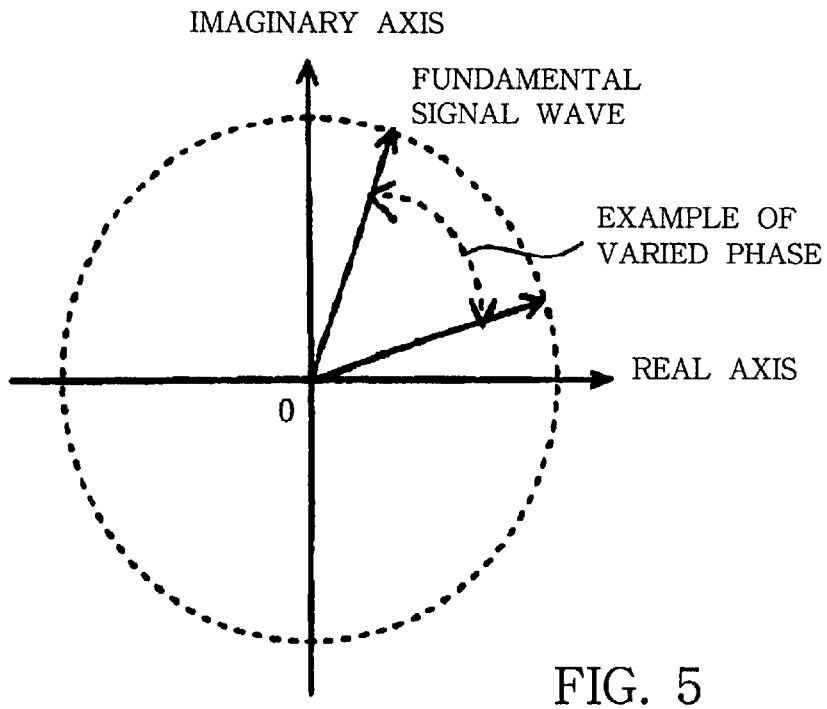
FIG. 5 is a diagram showing the amplitude and phase of a fundamental signal at a 0. terminal.

FIG. 5 shows, by way of example, a reflected wave of the fundamental signal at the 0. terminal P3 of the 3 dB coupler Q1. In the example shown in FIG. 5, the phase of the fundamental signal can variably controlled and rotated.

Figure 6:
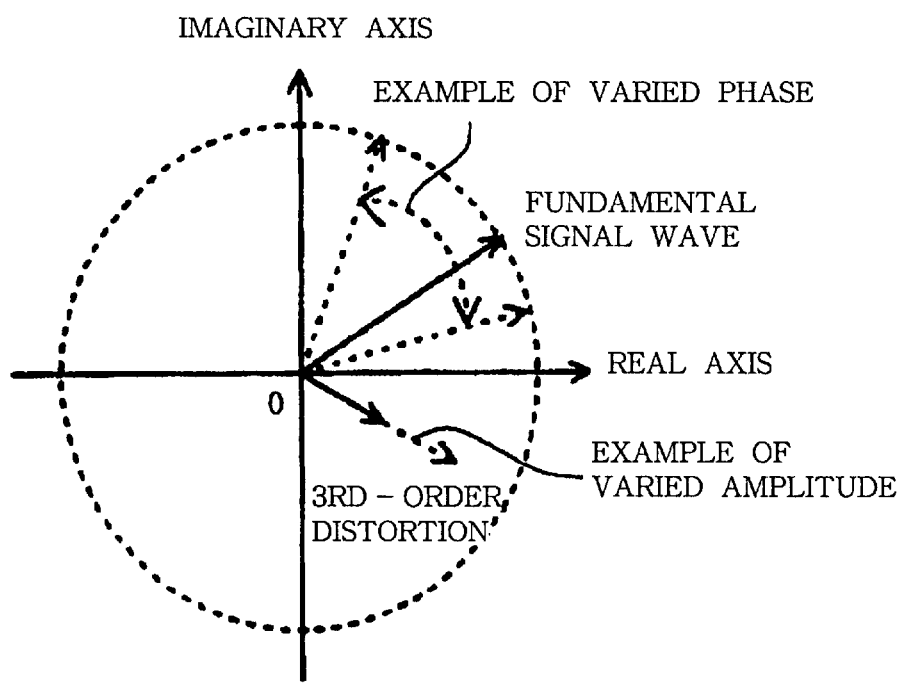
FIG. 6 is a diagram showing the amplitude and phase of a fundamental signal and a third-order distortion at an output terminal.

FIG. 6 shows, by way of example, the fundamental signal outputted from the output terminal P4 of the 3 dB coupler Q1 and the third-order distortion. Based on the control process described above, the distortion compensating device can set the amplitude ratio and the phase difference between the fundamental signal and the third-order distortion to arbitrary levels.

In the distortion compensating device, as described above, the third-order distortion generator generates a third-order distortion having an amplitude for canceling a third-order distortion generated by an amplifier depending on an input signal (fundamental signal), and the phase adjuster adjusts the phase of the input signal (fundamental signal) to set the phase difference between the input signal and the third-order distortion generated by the third-order distortion generator to a phase difference for canceling out the third-order distortion generated by the amplifier. The generated third-order distortion and the phase-adjusted input signal are combined with each other, and the combined signal is outputted from the output terminal P4 for compensating for the third-order distortion generated by the amplifier.

One example of operation of the distortion compensating device will be described below. Generally, when the power consumption by an amplifier is lowered, the intercept point IP3 of the amplifier is lowered, i.e., the proportion of a third-order distortion contained in an input signal of the amplifier is increased. If the distortion compensating device according to the present invention is used to compensate for the third-order distortion, then the apparent intercept point IP3 can be increased, i.e., the proportion of the third-order distortion contained in the output signal of the amplifier can be reduced. Thus, even if an amplifier having a low output saturation level is employed, a high-frequency low-distortion amplifier can be realized, with the result that the amplifier can be reduced in size, power requirements, and cost.

The extent to which the third-order distortion generated by the amplifier can be compensated for, i.e., the distortion improvement level, varies by controlling the DC voltages applied to the control voltage terminals of the third-order distortion generator and the phase adjuster. With the illustrated arrangement using the 3 dB coupler Q1, even when the DC voltages applied to the control voltage terminals are of fixed values, the distortion compensating device can achieve a distortion improvement level of about 6 dB at all times. Such a distortion improvement level is equivalent to an increase by 3 dB of the intercept point IP3, making it possible to reduce the power requirements of the amplifier to about half the power requirements which would have to be satisfied if no distortion compensation were carried out.

Since the distortion compensating device according to the above embodiment employs the 3 dB coupler Q1, the distortion compensating device can remove (attenuate) signals in frequency bands other than the fundamental signal and the third-order distortion even when an even-numbered-order distortion is generated by the diode assemblies D1, D2. Therefore, the generated even-numbered-order distortion can be removed. Furthermore, the illustrated arrangement of the embodiment is effective to greatly reduce the power consumption (substantially to zero, for example) by the third-order distortion generator connected to the 90. terminal P2 and the phase adjuster connected to the 0. terminal P3, and to output the applied fundamental signal with a small attenuation, so that the power requirements of the distortion compensating device can greatly be reduced.

In the distortion compensating device, the third-order distortion generated by the diode assemblies D1, D2 of the third-order distortion generator is 180 out of phase with the third-order distortion generated by the amplifier which is to be compensated for. Therefore, the phase of the fundamental signal may not variably be controlled by the phase adjuster.

The phase of the fundamental signal to be varied by the phase adjuster may be of a fixed value. For example, in the illustrated embodiment, the phase adjuster may output the phase of the applied fundamental signal without varying the phase, i.e., by adjusting the phase to the applied phase. In the illustrated embodiment, the phase of the fundamental signal is variably controlled for the reason that a slight phase error caused by distortion characteristics inherent in actual Schottky barrier diodes and the amplifier to be compensated for should variably be adjusted for ideal distortion compensation.

Similarly, the amplitude of the third-order distortion generated by the third-order distortion generator may not necessarily be variably controlled. Specifically, the amplitude of the third-order distortion generated by the third-order distortion generator may be of a fixed value insofar as it is set to a value capable of canceling out the third-order distortion generated by the amplifier which is to be compensated for.

As described above, the distortion compensating device according to the above embodiment has the coupler associated with the third-order distortion generator and the phase adjuster. Consequently, the distortion compensating device may comprise a coupler unit having such a coupler, and can be reduced in size. If the reduced-size distortion compensating device is incorporated in a portable telephone terminal, then the portable telephone terminal can be reduced in weight and can easily be carried around. In addition, the power requirements of the distortion compensating device can be reduced.

A specific example in which a third-order distortion generated by an amplifier is compensated for by the distortion compensating device according to the present invention will be described below.

Figure 7:
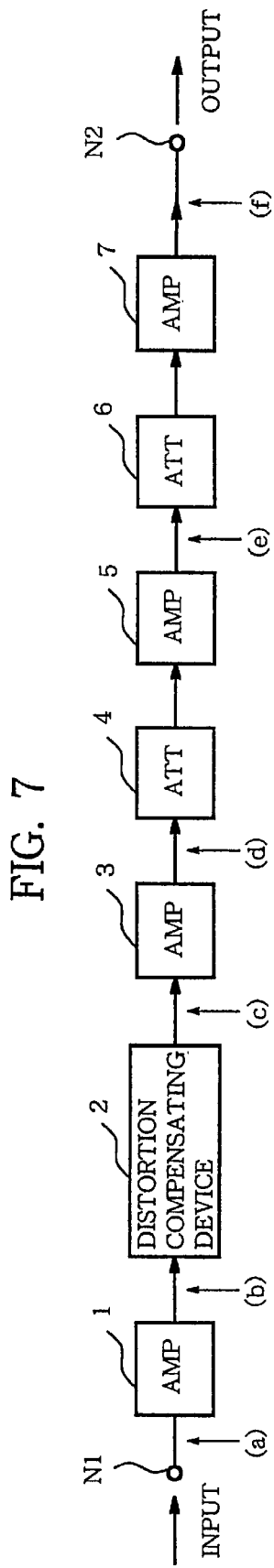
FIG. 7 is a block diagram of a signal processor having a distortion compensating device.

FIG. 7 shows in block form a signal processor which incorporates the distortion compensating device therein. As shown in FIG. 7, the signal processor comprises an amplifier (AMP) 1, a distortion compensating device 2 according to the present invention, an amplifier (AMP) 3, an attenuator (ATT) 4, an amplifier (AMP) 5, an attenuator (ATT) 6, and an amplifier (AMP) 7. The amplifier 1 comprises a low-distortion amplifier, for example, and the amplifiers 3, 5, 7 comprise power amplifiers, for example.

A frequency-converted modulated signal, for example, is supplied from an input terminal N1 to the amplifier 1, is processed by and passes through the distortion compensating device 2, the amplifier 3, the attenuator 4, the amplifier 5, the attenuator 6, and the amplifier 7, and is outputted from an output terminal N2. The distortion compensating device 2 compensates for third-order distortions generated by the amplifiers 1, 3, 5, 7. Specifically, the distortion compensating device 2 generates and outputs a third-order distortion for canceling out the sum of the third-order distortions generated by the amplifiers 1, 3, 5, 7.

Figure 8:
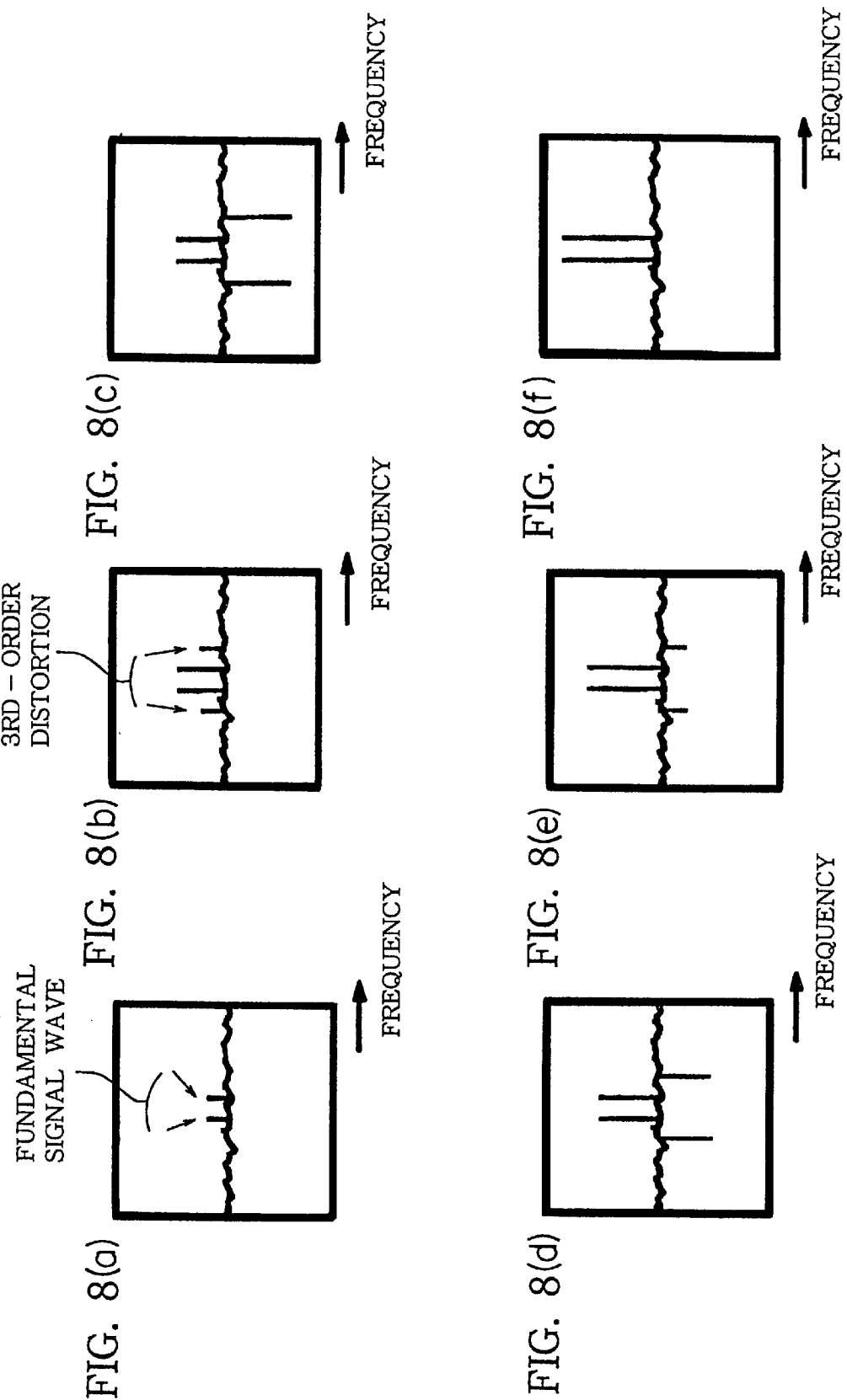
FIGS. 8(a) through 8(f) are diagrams showing the waveforms of signals in the signal processor shown in FIG. 7.

FIGS. 8(*a*) through 8(*f*) schematically show spectrums of a fundamental signal (fundamental signal wave) and third-order distortions generated in the signal processor shown in FIG. 7 at respective positions (a) through (f) therein in the distortion compensating process carried out by the distortion compensating device 2. In each of FIGS. 8(*a*) through 8(*f*), the horizontal axis represents a frequency and the vertical axis a signal intensity. For illustrative purpose, signals of two frequencies in the frequency band of the modulated signal applied to the input terminal N1 are indicated as the fundamental signal.

FIG. 8(*a*) shows the fundamental signal applied to the input terminal N1.

FIG. 8(*b*) shows a signal outputted from the amplifier 1, including a third-order distortion generated by the amplifier 1 and the fundamental signal.

FIG. 8(*c*) shows a signal outputted from the distortion compensating device 2, including a third-order distortion generated by the distortion compensating device 2, which is added to the third-order distortion outputted from the amplifier 1.

FIG. 8(*d*) shows a signal outputted from the amplifier 3, including a third-order distortion generated by the amplifier 3, which is added to the third-order distortion outputted from the distortion compensating device 2.

FIG. 8(*e*) shows a signal outputted from the amplifier 5, including a third-order distortion generated by the amplifier 5, which is added to the third-order distortion outputted from the amplifier 3.

FIG. 8(*f*) shows a signal outputted from the amplifier 7 to the output terminal N2, including a third-order distortion generated by the amplifier 7, which is added to the third-order distortion outputted from the amplifier 5. As shown in FIGS. 8(*a*) through 8(*f*), the third-order distortion generated by the distortion compensating device 2 cancels out the third-order distortions generated by the amplifiers 1, 3, 5, 7, so that no third-order distortion will be outputted from the output terminal N2.

A distortion compensating device according to a second embodiment of the present invention will be described below with reference to FIG. 9.

Figure 9:
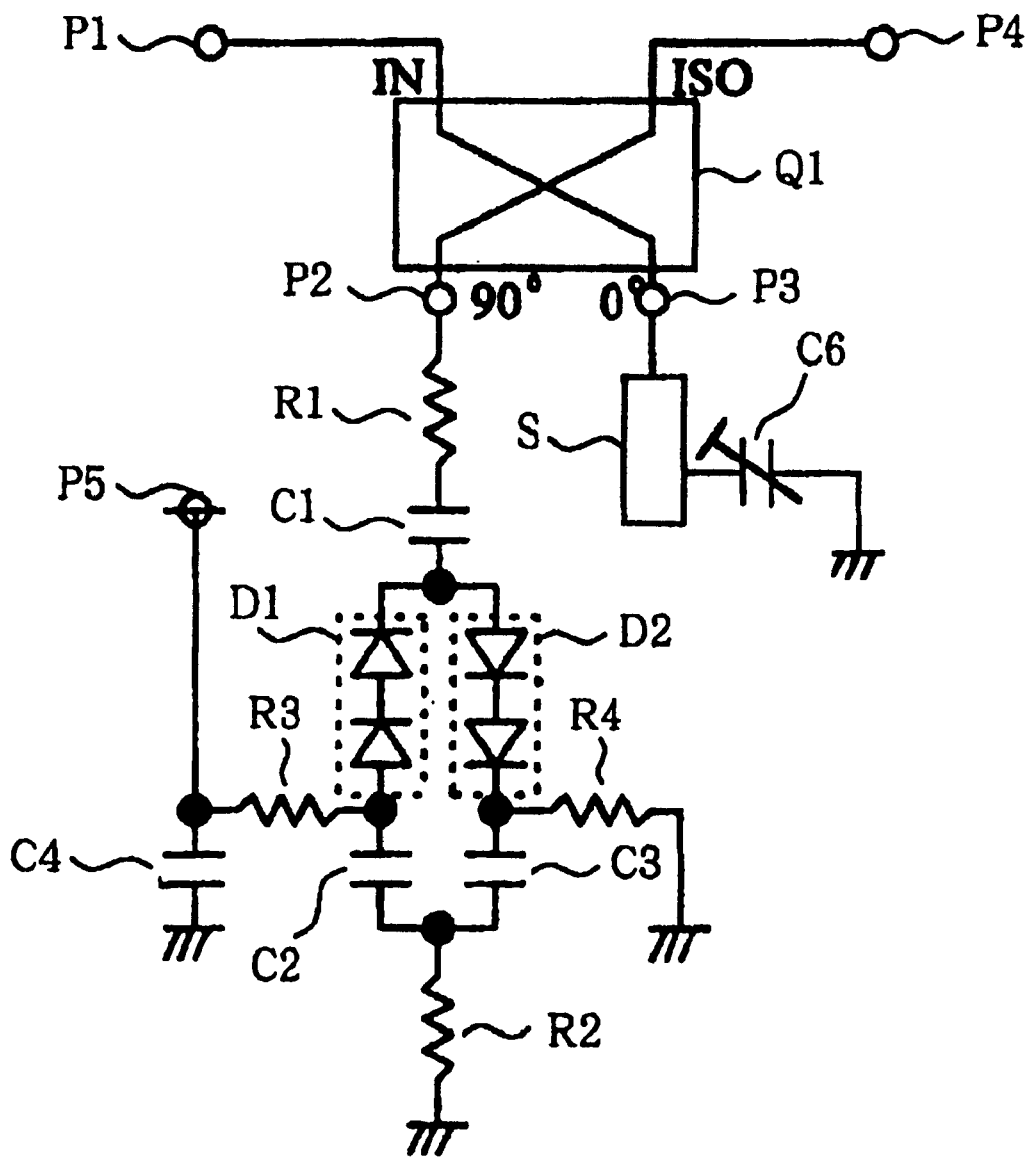
FIG. 9 is a circuit diagram of a distortion compensating device according to a second embodiment of the present invention.

As shown in FIG. 9, the distortion compensating device according to the second embodiment is basically the same as the distortion compensating device according to the first embodiment as shown in FIG. 2 except for the structure of the phase adjuster connected to the 0. terminal P3. Therefore, only the phase adjuster of the distortion compensating device according to the second embodiment will be described below.

According to the second embodiment, as shown in FIG. 9, the phase adjuster comprises a stub S connected to the 0. terminal P3 for rotating the phase of a fundamental signal, and a variable capacitor C6 connected to the stub S for varying the phase of the fundamental signal. An end of the variable capacitor C6 remote from its end connected to the stub S is grounded. The stub S may comprise an open stub or a short stub. Depending on the length of the stub S, the reactive component of the phase adjuster may become inductive or capacitive for adjusting the phase of only the fundamental signal.

For adjusting a slight phase error caused by performance variations of parts, the variable capacitor C6 should preferably comprise a trimmer capacitor. For use in automatic control applications, the variable capacitor C6 should preferably comprise a variable-capacitance capacitor whose capacitance can be varied under the control of an external voltage.

As with the phase adjuster of the distortion compensating device according to the first embodiment, the phase adjuster of the distortion compensating device according to the second embodiment is capable of adjusting the phase of only the fundamental signal. The distortion compensating device according to the second embodiment can variably control the phase difference between the fundamental signal and the third-order distortion by controlling the variable capacitor C6.

A distortion compensating device according to a third embodiment of the present invention will be described below with reference to FIG. 10.

Figure 10:
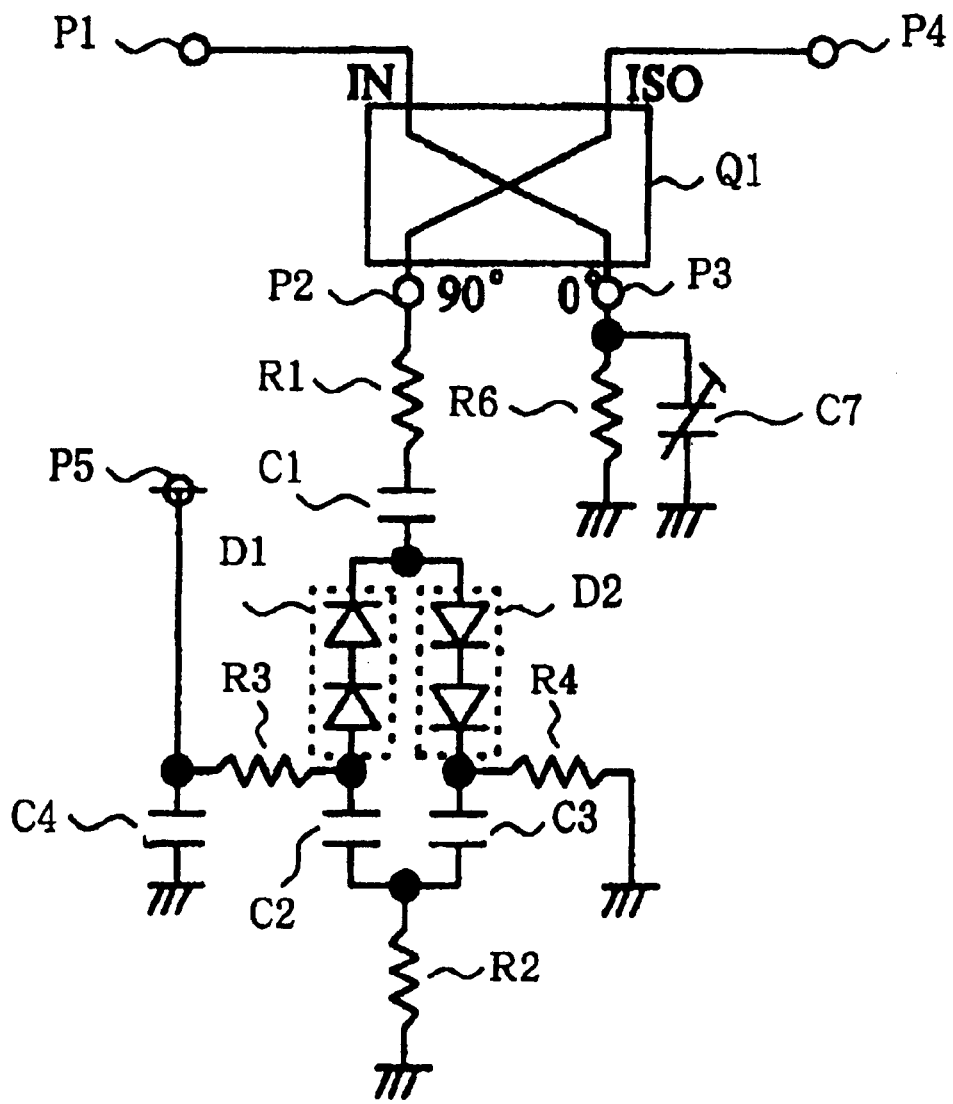
FIG. 10 is a circuit diagram of a distortion compensating device according to a third embodiment of the present invention.

As shown in FIG. 10, the distortion compensating device according to the third embodiment is basically the same as the distortion compensating device according to the first embodiment as shown in FIG. 2 except for the structure of the phase adjuster connected to the 0. terminal P3. Therefore, only the phase adjuster of the distortion compensating device according to the third embodiment will be described below.

According to the third embodiment, as shown in FIG. 10, the phase adjuster comprises a fixed resistor R6 and a variable capacitor C7 which are connected parallel to each other and to the 0. terminal P3. Ends of the fixed resistor R6 and the variable capacitor C7 which are remote from their ends connected to the 0. terminal P3 are connected to ground. The fixed resistor R6 comprises a resistor having a resistance of 100 k., for example, which is open at high frequencies. The parallel-connected circuit of the fixed resistor R6 and the variable capacitor C7 is open at a wide range of frequencies. The variable capacitor C7 comprises a variable-capacitance diode, for example, and may be in the form of a trimmer capacitor, for example.

As with the phase adjuster of the distortion compensating device according to the first embodiment, the phase adjuster of the distortion compensating device according to the third embodiment is capable of adjusting the phase of only the fundamental signal. The distortion compensating device according to the third embodiment can variably control the phase difference between the fundamental signal and the third-order distortion by controlling the variable capacitor C7.

In the distortion compensating devices according to the first through third embodiments, the third-order distortion generator is connected to the 90. terminal P2 of the 3 dB coupler Q1, and the phase adjuster is connected to the 0. terminal P3 of the 3 dB coupler Q1. However, the phase adjuster may be connected to the 90. terminal P2 of the 3 dB coupler Q1, and the third-order distortion generator may be connected to the 0. terminal P3 of the 3 dB coupler Q1. Such a modified distortion compensating device is also capable of generating and outputting a third-order distortion for compensating for the third-order distortion generated by the amplifier.

The distortion compensating device according to the present invention is not limited to the structural details of the first through third embodiments, but may have different structural details. For example, FETs or the like may be used as a device for generating a third-order distortion.

The distortion compensating device according to the present invention can compensate for a third-order distortion generated by one or more amplifiers.

Practically, the distortion compensating device according to the present invention should preferably be positioned at a stage preceding either a single amplifier whose third-order distortion is to be compensated for or the final one of plural amplifiers whose third-order distortions are to be compensated for. However, the distortion compensating device positioned at a stage following such an amplifier is also capable of compensating for a third-order distortion generated thereby.

In the first through third embodiments, the distortion compensating device is incorporated in a portable telephone terminal or the like of a portable communication system. However, the principles of the present invention are also applicable to various fields where the third-order distortion generated by an amplifier is to be compensated for. For example, the principles of the present invention are highly effective in a unit, such as a portable telephone terminal for W-CDMA communications, in which a signal in a wide frequency band is amplified by an amplifier because the compensation of the third-order distortion generated by the amplifier is particularly important.

Figure 11:
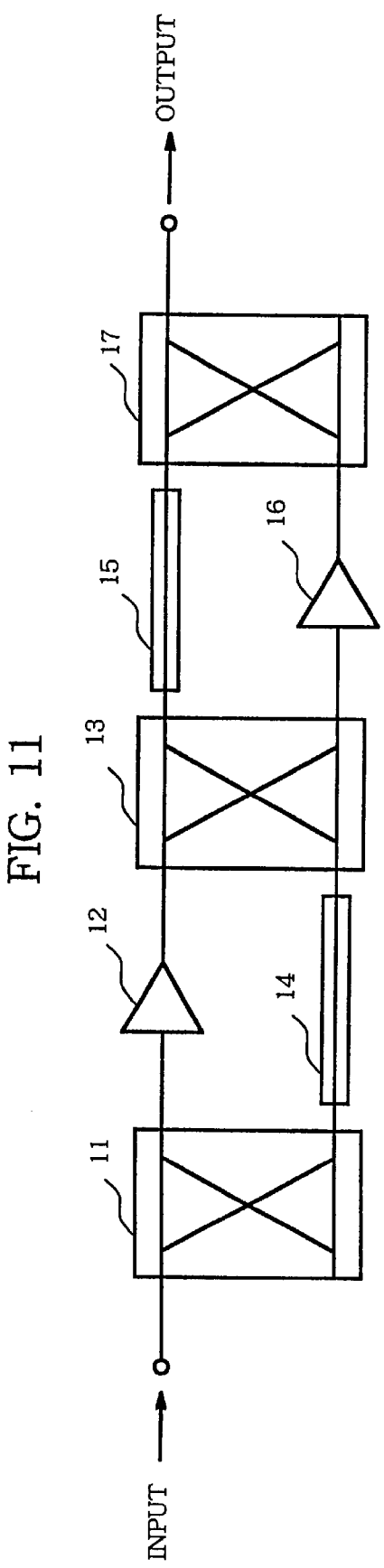
FIG. 11 shows an example of a feed-forward distortion-suppressed amplifier.

A distortion compensating device in accordance with the present invention may be used in combination with, for example, a feed-forward distortion-suppressed amplifier. FIG. 11 shows an example of the feed-forward distortion-suppressed amplifier. In the illustrated feed-forward distortion-suppressed amplifier, a coupler 11 distributes input signals to be amplified, and outputs one of the distributed signals to a main amplifier 12. The coupler 11 outputs the other distributed signal to a coupler 13 by way of a delay line 14.

Thereafter, the main amplifier 12 amplifies the one distributed signal fed from the coupler 11, and outputs a resultant signal to the coupler 13. The coupler 13 synthesizes part of the amplified signal fed from the main amplifier 12 with the other distributed signal delayed while passing through the delay line 14. The coupler 13 then acquires a distortion generated by the main amplifier 12 and outputs it to a sub amplifier 16. Moreover, the coupler 13 outputs the other part of the amplified signal fed from the main amplifier 12 to a coupler 17 by way of a delay line 15. The sub amplifier 16 amplifies the distortion fed from the coupler 13 and outputs a resultant distortion to the coupler 17. The coupler 17 synthesizes the other part of the amplified signal, which has been amplified by the main amplifier 12 and delayed while passing through the delay line 15, with the distortion amplified by the sub amplifier 16 so as to minimize a distortion contained in the other part. The coupler 17 then outputs the distortion-minimized other part as a signal having undergone amplification.

The foregoing main amplifier 12 and the foregoing sub amplifier 16 are generally formed by concatenating multiple stages of amplifiers each realized with an FET or the like. A distortion compensating device in accordance with the present invention may be included in, for example, the main amplifier 12 and used to compensate (for example, cancel) a third-order distortion generated by the main amplifier 12. Consequently, the main amplifier 12 can be reduced in size and in power requirements. Moreover, the level of a distortion to be input to the sub amplifier 16 is lowered. The sub amplifier 16 can therefore also be reduced in size and in power requirements. Eventually, the distortion compensating device can be reduced in size and in power requirements.

When the W-CDMA method is adopted or when a digital modulated wave employed must contain a wide range of frequencies and have a wide dynamic range, for example, the aforesaid main amplifier 12 is requested to exhibit excellent linearity. Therefore, a distortion compensating device in accordance with the present invention is, as mentioned above, adapted to the main amplifier 12. This makes it possible to lower the level of a third-order distortion generated by the main amplifier 12 by about 3 dB. Consequently, power (a distortion) output from the sub amplifier 16 can be minimized to approximately a half. Moreover, the main amplifier 12 and sub amplifier 16 can be, as mentioned above, reduced in size. The distortion compensating device can be reduced in size and improved in power efficiency. Eventually, the feed-forward distortion-suppressed amplifier can be reduced in size, and a digital portable telephone base station or the like to which the feed-forward distortion-suppressed amplifier is adapted can be reduced in size.

A distortion compensating device in accordance with the present invention can be adapted not only to the foregoing main amplifier 12 but also to, for example, the sub amplifier 16. The distortion compensating device in accordance with the present invention may be included in the sub amplifier 16 and used to compensate (for example, cancel) a third-order distortion generated by the sub amplifier 16. Whether the distortion compensating device in accordance with the present invention is adapted to either or both of the main amplifier 12 and the sub amplifier 16 may be determined arbitrarily according to a use situation of the distortion compensating device.

Although certain preferred embodiments of the present invention have been shown and described in detail, it should be understood that various changes and modifications may be made therein without departing from the scope of the appended claims.

What is claimed is:

1. A distortion compensating device for compensating for a third-order distortion generated by an amplifier, comprising:

a power distributor having a first terminal for supplying an input signal to be inputted to an amplifier, a second terminal, and a third terminal;

a third-order distortion generator connected to said second terminal for generating a third-order distortion having an amplitude for canceling out a third-order distortion generated by the amplifier depending on the supplied input signal; and a phase adjuster connected to said third terminal for adjusting the phase of the input signal to set the phase difference between the input signal and the third-order distortion generated by said third-order distortion generator to a phase difference for canceling out the third-order distortion generated by the amplifier;

said power distributor having a fourth terminal for combining and outputting the third-order distortion generated by said third-order distortion generator and the input signal whose phase is adjusted by said phase adjuster.

2. A distortion compensating device according to claim 1, wherein said power distributor comprises a 3 dB coupler.

3. A distortion compensating device according to claim 2, wherein said third-order distortion generator comprises a first fixed resistor connected to said second terminal, a first capacitor connected in series with said first fixed resistor, two diode assemblies connected to said first capacitor parallel to each other in opposite directions, for generating the third-order distortion, second and third capacitors connected in series with said diode assemblies, respectively, a second fixed resistor connecting said second and third capacitors to ground, a third fixed resistor connected between one of said diode assemblies and said second capacitor, a fourth capacitor connecting said third fixed resistor to ground, a fourth fixed resistor connecting a junction between the other of said diode assemblies and said third capacitor, and a control voltage terminal connected to said one of said diode assemblies through said third fixed resistor, the arrangement being such that the amplitude of the third-order distortion generated by said two diode assemblies can variably be controlled when a DC voltage applied from said control voltage terminal is controlled, and wherein said phase adjuster comprises a fixed resistor connecting said third terminal to ground, a variable capacitor connected to said third terminal parallel to said fixed resistor, and an inductor connected in series with said variable capacitor and connecting said variable capacitor to ground, the arrangement being such that the phase difference between the input signal and the third-order distortion can variably be controlled when the capacitance of said variable capacitor is controlled by a DC voltage applied from a control voltage terminal.

4. A distortion compensating device according to claim 2, wherein said third-order distortion generator comprises a first fixed resistor connected to said second terminal, a first capacitor connected in series with said first fixed resistor, two diode assemblies connected to said first capacitor parallel to each other in opposite directions, for generating the third-order distortion, second and third capacitors connected in series with said diode assemblies, respectively, a second fixed resistor connecting said second and third capacitors to ground, a third fixed resistor connected between one of said diode assemblies and said second capacitor, a fourth capacitor connecting said third fixed resistor to ground, a fourth fixed resistor connecting a junction between the other of said diode assemblies and said third capacitor, and a control voltage terminal connected to said one of said diode assemblies through said third fixed resistor, the arrangement being such that the amplitude of the third-order distortion generated by said two diode assemblies can variably be controlled when a DC voltage applied from said control voltage terminal is controlled, and wherein said phase adjuster comprises a stub connected to said third terminal for rotating the phase of the input signal, and a variable capacitor connecting said stub to ground for varying the phase of the input signal, the arrangement being such that the phase difference between the input signal and the third-order distortion can variably be controlled when the capacitance of said variable capacitor is controlled by a DC voltage applied from a control voltage terminal.

5. A distortion compensating device according to claim 2, wherein said third-order distortion generator comprises a first fixed resistor connected to said second terminal, a first capacitor connected in series with said first fixed resistor, two diode assemblies connected to said first capacitor parallel to each other in opposite directions, for generating the third-order distortion, second and third capacitors connected in series with said diode assemblies, respectively, a second fixed resistor connecting said second and third capacitors to ground, a third fixed resistor connected between one of said diode assemblies and said second capacitor, a fourth capacitor connecting said third fixed resistor to ground, a fourth fixed resistor connecting a junction between the other of said diode assemblies and said third capacitor, and a control voltage terminal connected to said one of said diode assemblies through said third fixed resistor, the arrangement being such that the amplitude of the third-order distortion generated by said two diode assemblies can variably be controlled when a DC voltage applied from said control voltage terminal is controlled, and wherein said phase adjuster comprises a fixed resistor and a variable capacitor connected parallel to each other and to said third terminal and having respective ends connected to ground remotely from said third terminal, the arrangement being such that the phase difference between the input signal and the third-order distortion can variably be controlled when the capacitance of said variable capacitor is controlled by a DC voltage applied from a control voltage terminal.

6. A distortion compensating device according to claim 2, incorporated in a communication unit of a portable communication system for compensating for a third-order distortion generated by an amplifier in the communication unit.

7. A distortion compensating device according to claim 2, incorporated in a communication unit of a W-CDMA system for compensating for a third-order distortion generated by an amplifier in the communication unit.

8. A distortion compensating device for compensating for a third-order distortion generated by an amplifier, comprising:

a power distributor having a first terminal for being supplied with an input signal from an amplifier, a second terminal, and a third terminal;

a third-order distortion generator connected to said second terminal for generating a third-order distortion having an amplitude for canceling out a third-order distortion generated by the amplifier depending on the supplied input signal; and a phase adjuster connected to said third terminal for adjusting the phase of the input signal to set the phase difference between the input signal and the third-order distortion generated by said third-order distortion generator to a phase difference for canceling out the third-order distortion generated by the amplifier;

said power distributor having a fourth terminal for combining and outputting the third-order distortion generated by said third-order distortion generator and the input signal whose phase is adjusted by said phase adjuster.

9. A distortion compensating device according to claim 8, wherein said power distributor comprises a 3 dB coupler.

10. A distortion compensating device according to claim 9, wherein said third-order distortion generator comprises a first fixed resistor connected to said second terminal, a first capacitor connected in series with said first fixed resistor, two diode assemblies connected to said first capacitor parallel to each other in opposite directions, for generating the third-order distortion, second and third capacitors connected in series with said diode assemblies, respectively, a second fixed resistor connecting said second and third capacitors to ground, a third fixed resistor connected between one of said diode assemblies and said second capacitor, a fourth capacitor connecting said third fixed resistor to ground, a fourth fixed resistor connecting a junction between the other of said diode assemblies and said third capacitor, and a control voltage terminal connected to said one of said diode assemblies through said third fixed resistor, the arrangement being such that the amplitude of the third-order distortion generated by said two diode assemblies can variably be controlled when a DC voltage applied from said control voltage terminal is controlled, and wherein said phase adjuster comprises a fixed resistor connecting said third terminal to ground, a variable capacitor connected to said third terminal parallel to said fixed resistor, and an inductor connected in series with said variable capacitor and connecting said variable capacitor to ground, the arrangement being such that the phase difference between the input signal and the third-order distortion can variably be controlled when the capacitance of said variable capacitor is controlled by a DC voltage applied from a control voltage terminal.

11. A distortion compensating device according to claim 9, wherein said third-order distortion generator comprises a first fixed resistor connected to said second terminal, a first capacitor connected in series with said first fixed resistor, two diode assemblies connected to said first capacitor parallel to each other in opposite directions, for generating the third-order distortion, second and third capacitors connected in series with said diode assemblies, respectively, a second fixed resistor connecting said second and third capacitors to ground, a third fixed resistor connected between one of said diode assemblies and said second capacitor, a fourth capacitor connecting said third fixed resistor to ground, a fourth fixed resistor connecting a junction between the other of said diode assemblies and said third capacitor, and a control voltage terminal connected to said one of said diode assemblies through said third fixed resistor, the arrangement being such that the amplitude of the third-order distortion generated by said two diode assemblies can variably be controlled when a DC voltage applied from said control voltage terminal is controlled, and wherein said phase adjuster comprises a stub connected to said third terminal for rotating the phase of the input signal, and a variable capacitor connecting said stub to ground for varying the phase of the input signal, the arrangement being such that the phase difference between the input signal and the third-order distortion can variably be controlled when the capacitance of said variable capacitor is controlled by a DC voltage applied from a control voltage terminal.

12. A distortion compensating device according to claim 9, wherein said third-order distortion generator comprises a first fixed resistor connected to said second terminal, a first capacitor connected in series with said first fixed resistor, two diode assemblies connected to said first capacitor parallel to each other in opposite directions, for generating the third-order distortion, second and third capacitors connected in series with said diode assemblies, respectively, a second fixed resistor connecting said second and third capacitors to ground, a third fixed resistor connected between one of said diode assemblies and said second capacitor, a fourth capacitor connecting said third fixed resistor to ground, a fourth fixed resistor connecting a junction between the other of said diode assemblies and said third capacitor, and a control voltage terminal connected to said one of said diode assemblies through said third fixed resistor, the arrangement being such that the amplitude of the third-order distortion generated by said two diode assemblies can variably be controlled when a DC voltage applied from said control voltage terminal is controlled, and wherein said phase adjuster comprises a fixed resistor and a variable capacitor connected parallel to each other and to said third terminal and having respective ends connected to ground remotely from said third terminal, the arrangement being such that the phase difference between the input signal and the third-order distortion can variably be controlled when the capacitance of said variable capacitor is controlled by a DC voltage applied from a control voltage terminal.

13. A distortion compensating device according to claim 9, incorporated in a communication unit of a portable communication system for compensating for a third-order distortion generated by an amplifier in the communication unit.

14. A distortion compensating device according to claim 9, incorporated in a communication unit of a W-CDMA system for compensating for a third-order distortion generated by an amplifier in the communication unit.

15. A distortion compensating device for compensating for the sum of third-order distortions generated by a plurality of amplifiers, comprising:

a power distributor having a first terminal for supplying an input signal to be inputted to an amplifier or being supplied with an input signal from an amplifier, a second terminal, and a third terminal;

a third-order distortion generator connected to said second terminal for generating a third-order distortion having an amplitude for canceling out the sum of third-order distortions generated by a plurality of amplifiers depending on the input signal; and a phase adjuster connected to said third terminal for adjusting the phase of the input signal to set the phase difference between the input signal and the third-order distortion generated by said third-order distortion generator to a phase difference for canceling out the sum of third-order distortions generated by the amplifiers;

said power distributor having a fourth terminal for combining and outputting the third-order distortion generated by said third-order distortion generator and the input signal whose phase is adjusted by said phase adjuster.

16. A distortion compensating device according to claim 15, wherein said power distributor comprises a 3 dB coupler.

17. A distortion compensating device according to claim 16, wherein said third-order distortion generator comprises a first fixed resistor connected to said second terminal, a first capacitor connected in series with said first fixed resistor, two diode assemblies connected to said first capacitor parallel to each other in opposite directions, for generating the third-order distortion, second and third capacitors connected in series with said diode assemblies, respectively, a second fixed resistor connecting said second and third capacitors to ground, a third fixed resistor connected between one of said diode assemblies and said second capacitor, a fourth capacitor connecting said third fixed resistor to ground, a fourth fixed resistor connecting a junction between the other of said diode assemblies and said third capacitor, and a control voltage terminal connected to said one of said diode assemblies through said third fixed resistor, the arrangement being such that the amplitude of the third-order distortion generated by said two diode assemblies can variably be controlled when a DC voltage applied from said control voltage terminal is controlled, and wherein said phase adjuster comprises a stub connected to said third terminal for rotating the phase of the input signal, and a variable capacitor connecting said stub to ground for varying the phase of the input signal, the arrangement being such that the phase difference between the input signal and the third-order distortion can variably be controlled when the capacitance of said variable capacitor is controlled by a DC voltage applied from a control voltage terminal.

18. A distortion compensating device according to claim 16, wherein said third-order distortion generator comprises a first fixed resistor connected to said second terminal, a first capacitor connected in series with said first fixed resistor, two diode assemblies connected to said first capacitor parallel to each other in opposite directions, for generating the third-order distortion, second and third capacitors connected in series with said diode assemblies, respectively, a second fixed resistor connecting said second and third capacitors to ground, a third fixed resistor connected between one of said diode assemblies and said second capacitor, a fourth capacitor connecting said third fixed resistor to ground, a fourth fixed resistor connecting a junction between the other of said diode assemblies and said third capacitor, and a control voltage terminal connected to said one of said diode assemblies through said third fixed resistor, the arrangement being such that the amplitude of the third-order distortion generated by said two diode assemblies can variably be controlled when a DC voltage applied from said control voltage terminal is controlled, and wherein said phase adjuster comprises a stub connected to said third terminal for rotating the phase of the input signal, and a variable capacitor connecting said stub to ground for varying the phase of the input signal, the arrangement being such that the phase difference between the input signal and the third-order distortion can variably be controlled when the capacitance of said variable capacitor is controlled by a DC voltage applied from a control voltage terminal.

19. A distortion compensating device according to claim 16, wherein said third-order distortion generator comprises a first fixed resistor connected to said second terminal, a first capacitor connected in series with said first fixed resistor, two diode assemblies connected to said first capacitor parallel to each other in opposite directions, for generating the third-order distortion, second and third capacitors connected in series with said diode assemblies, respectively, a second fixed resistor connecting said second and third capacitors to ground, a third fixed resistor connected between one of said diode assemblies and said second capacitor, a fourth capacitor connecting said third fixed resistor to ground, a fourth fixed resistor connecting a junction between the other of said diode assemblies and said third capacitor, and a control voltage terminal connected to said one of said diode assemblies through said third fixed resistor, the arrangement being such that the amplitude of the third-order distortion generated by said two diode assemblies can variably be controlled when a DC voltage applied from said control voltage terminal is controlled, and wherein said phase adjuster comprises a fixed resistor and a variable capacitor connected parallel to each other and to said third terminal and having respective ends connected to ground remotely from said third terminal, the arrangement being such that the phase difference between the input signal and the third-order distortion can variably be controlled when the capacitance of said variable capacitor is controlled by a DC voltage applied from a control voltage terminal.

20. A feed-forward distortion-suppressed amplifier comprising:
a distributing means for distributing signals to be amplified;
a main amplifier for amplifying one of the distributed signals;
a distortion acquiring means for synthesizing part of the signal amplified by said main amplifier with the other distributed signal so as to acquire a distortion generated by said main amplifier;
a sub amplifier for amplifying the acquired distortion; and
a distortion minimizing means for synthesizing the other part of the signal amplified by said main amplifier with the amplified distortion so as to minimize a distortion contained in the other part,
wherein a distortion compensating device set forth in claim 1 is included in said main amplifier and used to compensate a third-order distortion generated by said main amplifier.

21. A feed-forward distortion-suppressed amplifier comprising:
a distributing means for distributing signals to be amplified;
a main amplifier for amplifying one of the distributed signals;
a distortion acquiring means for synthesizing part of the signal amplified by said main amplifier with the other distributed signal so as to acquire a distortion generated by said main amplifier;
a sub amplifier for amplifying the acquired distortion; and
a distortion minimizing means for synthesizing the other part of the signal amplified by said main amplifier with the amplified distortion so as to minimize a distortion contained in the other part,
wherein a distortion compensating device set forth in claim 1 is included in said sub amplifier and used to compensate a third-order distortion generated by said sub amplifier.

22. A feed-forward distortion-suppressed amplifier comprising:
a distributing means for distributing signals to be amplified;
a main amplifier for amplifying one of the distributed signals;
a distortion acquiring means for synthesizing part of the signal amplified by said main amplifier with the other distributed signal so as to acquire a distortion generated by said main amplifier;
a sub amplifier for amplifying the acquired distortion; and
a distortion minimizing means for synthesizing the other part of the signal amplified by said main amplifier with the amplified distortion so as to minimize a distortion contained in the other part,
wherein a distortion compensating device set forth in claim 1 is included in said main amplifier and used to compensate a third-order distortion generated by said main amplifier; and
a distortion compensating device set form in claim 1 is included in said sub amplifier and used to compensate a third-order distortion generated by said sub amplifier.

23. A digital portable telephone base station characterized in that a feed-forward distortion-suppressed amplifier set forth in claim 20 is included for amplifying a communication signal.

24. A feed-forward distortion-suppressed amplifier comprising:
- a distributing means for distributing signals to be amplified;
- a main amplifier for amplifying one of the distributed signals;
- a distortion acquiring means for synthesizing part of the signal amplified by said main amplifier with the other distributed signal so as to acquire a distortion generated by said main amplifier;
- a sub amplifier for amplifying the acquired distortion; and
- a distortion minimizing means for synthesizing the other part of the signal amplified by said main amplifier with the amplified distortion so as to minimize a distortion contained in the other part,
- wherein a distortion compensating device set forth in claim 8 is included in said main amplifier and used to compensate a third-order distortion generated by said main amplifier.

25. A feed-forward distortion-suppressed amplifier comprising:
- a distributing means for distributing signals to be amplified;
- a main amplifier for amplifying one of the distributed signals;
- a distortion acquiring means for synthesizing part of the signal amplified by said main amplifier with the other distributed signal so as to acquire a distortion generated by said main amplifier;
- a sub amplifier for amplifying the acquired distortion; and
- a distortion minimizing means for synthesizing the other part of the signal amplified by said main amplifier with the amplified distortion so as to minimize a distortion contained in the other part,
- wherein a distortion compensating device set forth in claim 15 is included in said main amplifier and used to compensate a third-order distortion generated by said main amplifier.

26. A feed-forward distortion-suppressed amplifier comprising:
- a distributing means for distributing signals to be amplified;
- a main amplifier for amplifying one of the distributed signals;
- a distortion acquiring means for synthesizing part of the signal amplified by said main amplifier with the other distributed signal so as to acquire a distortion generated by said main amplifier;
- a sub amplifier for amplifying the acquired distortion; and
- a distortion min g means for synthesizing the other part of the signal amplified by said main amplifier with the amplified distortion so as to mininimize a distortion contained in the other part,
- wherein a distortion compensating device set forth in claim 8 is included in said sub amplifier and used to compensate a third-order distortion generated by said sub amplifier.

27. A feed-forward distortion-suppressed amplifier comprising:
- a distributing means for distributing signals to be amplified;
- a main amplifier for amplifying one of the distributed signals;
- a distortion acquiring means for synthesizing part of the signal amplified by said main amplifier with the other distributed signal so as to acquire a distortion generated by said main amplifier;
- a sub amplifier for amplifying the acquired distortion; and
- a distortion minimizing means for synthesizing the other part of the signal amplified by said main amplifier with the amplified distortion so as to minimize a distortion contained in the other part,
- wherein a distortion compensating device set forth in claim 15 is included in said sub amplifier and used to compensate a third-order distortion generated by said sub amplifier.

28. A feed-forward distortion-suppressed amplifier comprising:
- a distributing means for distributing signals to be amplified;
- a main amplifier for amplifying one of the distributed signals;
- a distortion acquiring means for synthesizing part of the signal amplified by said main amplifier with the other distributed signal so as to acquire a distortion generated by said main amplifier;
- a sub amplifier for amplifying the acquired distortion; and
- a distortion minimizing means for synthesizing the other part of the signal amplified by said main amplifier with the amplified distortion so as to minimize a distortion contained in the other part,
- wherein a distortion compensating device set forth in claim 8 is included in said main amplifier and used to compensate a third-order distortion generated by said main amplifier; and
- a distortion compensating device form in claim 8 is included in said sub amplifier and used to compensate a third-order distortion generated by said sub amplifier.

29. A feed-forward distortion-suppressed amplifier comprising:
- a distributing means for distributing signals to be amplified;
- a main amplifier for amplifying one of the distributed signals;
- a distortion acquiring means for synthesizing part of the signal amplified by said main amplifier with the other distributed signal so as to acquire a distortion generated by said main amplifier;
- a sub amplifier for amplifying the acquired distortion; and
- a distortion minimizing means for synthesizing the other part of the signal amplified by said main amplifier with the amplified distortion so as to minimize a distortion contained in the other part,
- wherein a distortion compensating device set forth in claim 15 is included in said main amplifier and used to compensate a third-order distortion generated by said main amplifier; and
- a distortion compensating device form in claim 15 is included in said sub amplifier and used to compensate a third-order distortion generated by said sub amplifier.

30. A digital portable telephone base station characterized in that a feed-forward distortion-suppressed amplifier set forth in claim 21 is included for amplifying a communication signal.

31. A digital portable telephone base station characterized in that a feed-forward distortion-suppressed amplifier set forth in claim 22 is included for amplifying a communication signal.

* * * * *